United States Patent
Morfill et al.

(10) Patent No.: US 6,616,987 B1
(45) Date of Patent: Sep. 9, 2003

(54) PROCEDURE AND DEVICE FOR SPECIFIC PARTICLE MANIPULATION AND DEPOSITION

(75) Inventors: Gregor Morfill, München (DE); Hubertus Thomas, Pfaffenhofen/Ilm (DE); Timo Stuffler, Landsberied (DE); Uwe Konopka, Neufahrn (DE)

(73) Assignee: Max-Planck-Gesellschaft zur Forderung der Wissenschaften E.V. (DE)

( * ) Notice: Subject to any disclaimer, the term of this patent is extended or adjusted under 35 U.S.C. 154(b) by 0 days.

(21) Appl. No.: 09/676,366

(22) Filed: Sep. 29, 2000

Related U.S. Application Data

(63) Continuation of application No. PCT/EP99/02241, filed on Apr. 4, 1999.

(30) Foreign Application Priority Data

Apr. 2, 1998 (DE) .......................................... 198 14 871

(51) Int. Cl.[7] .............................. H05H 1/02; H05H 1/03; H05H 1/46; H01L 21/203; H01L 21/208
(52) U.S. Cl. ........................ 427/569; 427/570; 427/572; 427/578; 438/758
(58) Field of Search ................................ 427/569, 572, 427/578, 570; 438/758

(56) References Cited

U.S. PATENT DOCUMENTS

| | | | | |
|---|---|---|---|---|
| 5,102,496 A | * | 4/1992 | Savas | ......................... 156/643 |
| 5,108,543 A | | 4/1992 | Suzuki et al. | |
| 5,401,356 A | * | 3/1995 | Enami | ......................... 156/643 |
| 5,433,258 A | * | 7/1995 | Barns et al. | ............. 156/643.1 |
| 5,456,796 A | * | 10/1995 | Gupta et al. | ............. 156/643.1 |
| 5,494,523 A | * | 2/1996 | Steger | ..................... 118/723 E |
| 5,543,184 A | * | 8/1996 | Barns et al. | ................. 427/571 |
| 5,573,597 A | * | 11/1996 | Lantsman | ............ 118/723 MP |
| 5,609,690 A | | 3/1997 | Watanabe et al. | |
| 5,637,190 A | * | 6/1997 | Liao | ........................... 438/726 |
| 5,693,179 A | * | 12/1997 | Blackburn et al. | ........ 156/643.1 |
| 5,693,238 A | * | 12/1997 | Schmitt et al. | ................ 216/67 |
| 5,746,928 A | * | 5/1998 | Yen et al. | ..................... 216/37 |
| 5,854,138 A | * | 12/1998 | Roth et al. | ................... 438/714 |

FOREIGN PATENT DOCUMENTS

| | | |
|---|---|---|
| DE | 37 29 347 C2 | 3/1988 |
| DE | 40 18 954 C2 | 1/1991 |
| DE | 41 18 072 A1 | 12/1992 |
| DE | 43 16 349 A1 | 11/1994 |
| DE | 195 38 045 C1 | 1/1997 |
| DE | 197 13 637 A1 | 10/1998 |
| EP | 0 186 910 B1 | 12/1989 |
| JP | 04 103769 | 4/1992 |
| WO | WO 98/44766 | 10/1998 |

OTHER PUBLICATIONS

Law et al., "Dust Particles Interaction in RF Plasma Sheaths" 1996 13th European Sect. Conference on the Atomic Molecular Physics of Ionized Gases p. 187–188, 1996 No month.*

Steel, "The Movement of Dust Particles in a Plasma by Means of a Laser Beam", The Institute of Electrical Engineers, Savoy Place, London UK, 1998.*

Chu et al "Coulomb Lattice in a Weakly Ionized Colloidal Plasma" Physics A vol. 205, p. 183–190, Apr. 1, 1994.*

(List continued on next page.)

*Primary Examiner*—Marianne Padgett
(74) *Attorney, Agent, or Firm*—Piper Rudnick LLP

(57) ABSTRACT

A process for manipulating particles distributed substantially non-uniformly in a plasma of a carrier or reaction gas, wherein Coulomb interaction between the particles is so low that the particles substantially do not form a plasmacrystalline state, and the particles are exposed in a location-selective manner to external adjustment forces and/or the plasma conditions are subjected to a location-selective change to apply at least a portion of the particles onto a substrate surface mask-free and/or subject it to a location-selective plasma treatment in the carrier or reaction gas.

12 Claims, 9 Drawing Sheets

OTHER PUBLICATIONS

P. Roca i Cabarrocas et al., "Nanostructured Silicon Thin Films: A New Material for Photovoltaics?", in "14$^{th}$ European Photovoltaic Solar Energy Conference", Barcelona 1997, Paper No. P5A.20 pp. 1–4 Jun. 30–Jul. 7, 1997.

D.M. Tanenbaum et al., "Nanoparticle Deposition in Hydrogenated Amorphous Silicon Films During rf Plasma Deposition", in "Applied Physics Letters", 1996, vol. 69, pp. 1705–1707 Mar. 18.

H. Thomas et al., "Melting Dynamics of a Plasma Crystal", in "Nature", 1996, vol. 379, pp. 806–809 Feb. 29, 1996.

H. Thomas et al, "Plasma Crystal: Coulomb Crystallization in a Dusty Plasma", in "Physical Review Letter.", 1994, vol. 73, pp652–655.

* cited by examiner

PROCEDURE AND DEVICE FOR SPECIFIC PARTICLE MANIPULATION AND DEPOSITION

RELATED APPLICATION

This is a continuation of PCT/EP99/02241, with an international filing date of Apr. 4, 1999, which is based on German Patent Application No. 198 14 871.2, filed Apr. 2, 1998.

FIELD OF THE INVENTION

This invention relates to a procedure and device for the specific manipulation and/or deposition of microscopic particles in high-frequency plasma.

BACKGROUND

As is generally known, formation of high-frequency plasma in the respective reaction gas is a suitable means for achieving the desired degradation reactions or the like for processing or degradation procedures such as plasma etching, or chemical vapor deposition (CVD). To optimize CVD applications, e.g., for separating amorphous, hydrogenated silicon (a-Si:H) for photovoltaic devices, thin-film transistors, flat-screen displays or color detectors in imaging systems, there are numerous studies on how the properties of deposited layers depend on plasma parameters, e.g., the types of reaction gas, HF voltage or gas pressure. It has been shown that microscopic particles (so-called "particles") can form in the plasma and have a disruptive or facilitative effect on the layer properties, depending on the application.

For example, in "Appl. Phys. Lett.", Vol. 69, 1996, pp. 1705 forward, D. M. Tanenbaum et al. describe the formation of particles in plasma during a-Si:H deposition as follows: Negative ions are formed in the silane reaction gas as the result of electron bombardment, and react in the plasma with radicals and cations. This produces growing particles, which have a negative charge, as the electron velocities are significantly higher in comparison to the cation velocities. Due to the formation of space charge regions near the electrodes, these particles, which can grow to $\mu$m dimension sizes, to not get to the substrate, which generally is secured to one of the electrodes. D. M. Tanenbaum et al. showed that, despite the space charge zone, particles ranging from roughly 2 to 14 nm in size reach the substrate during plasma discharge and, once there, can trigger disruptions in the layer properties.

In the "14$^{th}$ European Photovoltaic Solar Energy Conference" (Barcelona 1997), Paper No. P5A.20, P. Roca i Cabarrocas et al. describe a significant improvement in charge carrier transport in a-Si:H layers by embedding particles. The particles arise under specific pressure conditions in the reaction gas, and are identified by characteristic, so-called "hydrogen evolution" measurements in the layer. The layers containing the particles exhibit a considerable increase in dark conductance and photoconductivity in comparison to amorphous layers. In addition, a considerable improvement was achieved in the stability of photoelectric properties under illumination.

One general problem in the previous studies on the effects of particles in CVD deposited layers is that a means for the targeted and reproducible handling of particles occurring irregularly in the reaction gas has thus far not been available. A particular problem in this case is that the particles can arise within roughly 1 second at the usual plasma frequencies of about 14 MHz.

Additional aspects of particle formation are illustrated below making reference to a conventional device according to FIG. 13.

In a plasma state, e.g., generated by a glow or gas discharge, a gas encompasses particles of varying charge, e.g., positively or negatively charged ions, electrons and radicals, but also neutral atoms. If microscopic particles (up to several 10 $\mu$m in size), e.g., dust particles, form or exist in the plasma, these take on an electrical charge. The charge can reach several hundred thousand electron charges depending on the particle size and plasma conditions (type of gas, plasma density, temperature, pressure, etc.).

In the known device shown in FIG. 13, two flat discharge electrodes 11 and 12 are arranged one atop the other in a reactor (vessel walls not shown) with a carrier gas. The lower circular or disk-shaped HF electrode 11 is actuated with an alternating voltage, while the upper, annular counter-electrode 12 is grounded, for example. The electrode distance measures roughly 2 cm. A control circuit 13 is set up to connect the HF generator 14 with the HF electrode 11 and actuate the grounding and separation circuit 15 of the counter-electrode 12. The high-frequency energy can be injected with a frequency of 13.56 MHz and a power of roughly 5 W, for example. The carrier gas is formed by inert gases or reactive gases at a pressure of approx. 0.01–2 mbar.

A state of equilibrium preferably sets in among the particles, in which the gravitational force G acting on the particles is balanced with an electrical field strength E, to which the particles are exposed as the result of a space charge near the HF electrode 11 as a function of their charge. Also known is the formation of plasma crystalline states of particle configurations, but this is limited to particles with characteristic dimensions exceeding 20 nm, since the respectively carried charge is so low for smaller particles that thermal fluctuations have a stronger influence on the particles than the Coulomb interactions required for the plasma crystals, so that a uniform structure cannot be formed. In addition, formation of plasma crystals was previously limited to particles introduced into the reaction space from outside, e.g. dust particles. Therefore, a targeted handling of nanocrystalline particles, in particular with characteristic sizes of a few to several 10 nm, could not be derived from the manipulation of particles arranged in a plasmacrystalline manner.

However, in view of the known influence of structural or photoelectric properties of deposited layers resulting from built-in nanocrystalline particles, there is a strong interest in being able to control particle incorporation, in particular with regard to the type, size, number and position of the particles.

The manipulation of particles in a plasmacrystalline state is known from PCT patent application WO 98/44766 being published after the priority date of the present patent application. In JP 04-103769, a Laser-CVD-procedure is described.

Thus, it would be advantageous to provide a method for the specific manipulation or separation (deposition) of particles in or from plasmas, in particular, for influencing the particles themselves or modifying a substrate surface or a layer, and a device for implementing the procedure.

SUMMARY OF THE INVENTION

When exposed to a sufficiently energetic irradiation, which triggers in particular a discharging or reversing the charge of the particles, or exerts a light pressure, particles that arise internally in the reaction space with an ignited plasma, or are provided to the reaction space from outside (externally) and initially have a negative charge, are moved to an altered target position from an initial position corresponding to the force equilibrium of the negatively charged particles. The particles can have sizes ranging from several nanometers to roughly 100 $\mu$m. The energetic irradiation can encompass laser radiation to trigger a discharge, a UV laser or electron irradiation for reversing particle charge via secondary electron emission, or light irradiation to generate a light pressure. The target position of the particles can be a range with altered plasma conditions, or a substrate on which the particles are applied alone or simultaneously with layer formation via plasma deposition.

The nanoparticles exhibit a substantially non-uniform spatial distribution in the plasma. This means that the nanoparticles are randomly distributed relative to each other, at statistically distributed locations. To this end, the conditions in the reaction space, in particular the plasma conditions, e.g., the ratio of electrons to ions in the plasma, are adjusted depending on the particles in such a way that the particles possess such a high energy that substantially no ordered or plasma crystalline states are formed.

A special advantage to the invention is that the energy-rich irradiation of the particles initially distributed substantially non-uniformly in the plasma takes place in a location-selective manner, so that particles are exposed in the form of a masking of altered plasma conditions in predetermined, selected plasma areas, or applied to the substrate based on a deposition pattern.

The equilibrium in particular between the gravitational force and electrical forces on the particles in the initial position can also be influenced by a location-dependent change in a static or low-frequency alterable electrical field between the electrodes of a plasma reactor (exertion of external adjustment forces). In this way, the particles in the plasma can be arranged on surfaces curved in whatever way with any edges. Therefore, the particles in the plasma can be moved in a predetermined manner, wherein this movement is even reversible, so that the particle arrangement can be adjusted between various conformations.

Another aspect of the invention is that the location-selective deformation of a substantially non-uniform particle arrangement subjects it to different plasma conditions in various partial subdomains. This enables a location-selective plasma treatment of particle areas (e.g., coating or stripping), in particular in plasma between two essentially flat electrodes. Application to a substrate can follow such a location-selective particle treatment.

In addition, an aspect to the invention lies in the fact that the formation of a particle arrangement is not influenced by the presence of a substrate in a plasma reactor, in particular, between reactor electrodes for generating a glow or gas discharge. In particular, it is possible to perform the aforementioned conversion processes in direct proximity to a tabular, flat or bent substrate, and then to reduce the distance between the particles in the particle arrangement and substrate surface in such a way that at least a predetermined portion of the particles is applied to the substrate surface. The reduction in distance can either be achieved by influencing the field strengths that hold the particles in position, or by moving the substrate surface. As a result, the particles can be deposited on substrate surfaces in patterns configured as desired. Therefore, the invention provides a novel, location-selective, mask-free coating procedure with which modified surfaces are generated. The applied particles give the modified surfaces altered electronic, optical and/or mechanical properties. However, it is also possible to use the particles applied in a location-selective manner themselves to mask or condition the substrate surface before or during an ensuing additional coating step.

A device according to the invention for manipulating particles encompasses a reaction vessel, which contains means for generating a plasma and at least one substrate. The means for generating the plasma preferably consist of tabular, essentially parallel electrodes, between which the substrate can be moved. The electrodes in the reaction vessel can exhibit field-forming structures for the location-selective influencing of the particles. The reaction vessel can also contain means for location-selective particle discharging (e.g., UV lighting means with a masking device), means for exposing the particles to radiation pressure, monitoring means and control means.

One special aspect of the invention involves configuring the electrodes for the location-selective influencing of particles in the reaction vessel. According to the invention, an electrode arrangement (or adaptive electrode) is described that exhibits numerous electrode segments, which are actuated substantially simultaneously with a high-frequency voltage, and each individually with a segment-specific direct voltage or low-frequency voltage. The high-frequency voltage generates or maintains a plasma state in the reaction vessel, while the direct or low-frequency voltage generates a static or slowly variable field distribution (field E) in the reaction vessel, during exposure to which the particles become arranged or move in the reaction vessel.

Additional features of the adaptive electrode include the formation of a matrix arrangement comprised of miniaturized electrode segments, the shaping of the matrix arrangement as an essentially flat, laminated component, whose electrode side faces the reaction vessel, and whose backside carries control electronics, the pressure relief of the component, e.g., via the generation of a vacuum in the space which the back of the electrode arrangement faces, and the provision of a temperature control device for the control electronics.

BRIEF DESCRIPTION OF THE DRAWINGS

Details and advantages to the invention will be described below making reference to the attached drawings. Shown on.

DETAILED DESCRIPTION OF THE INVENTION

Figure 13:
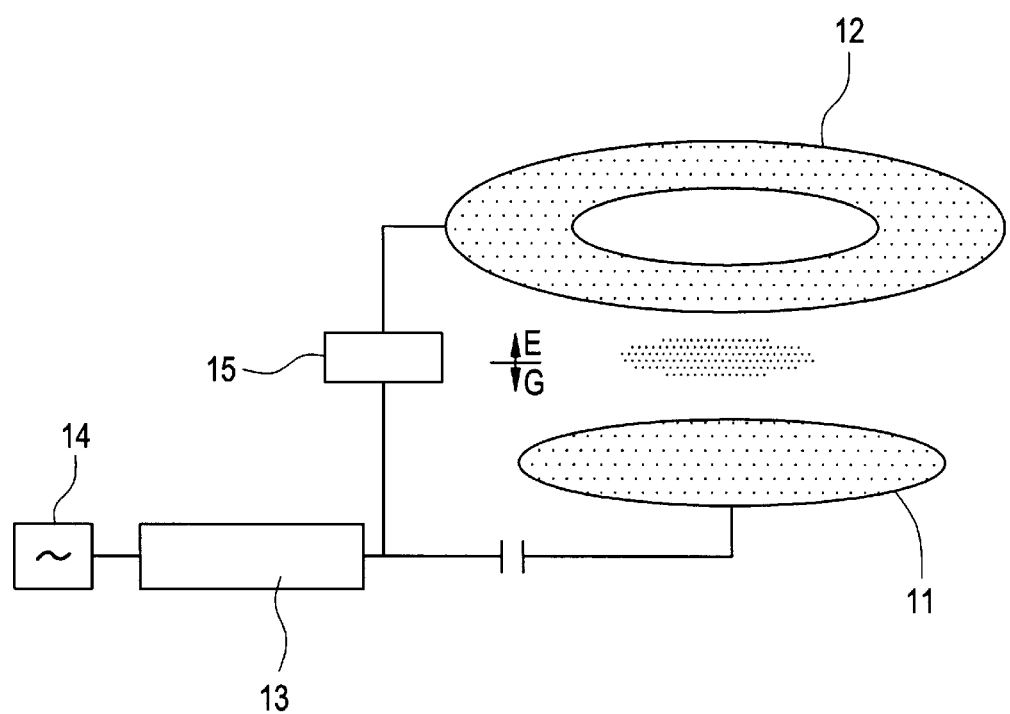
FIG. 13 is a diagrammatic perspective view of a conventional reactor (prior art).

In the following, the invention will be described based on the example of a plasma device, wherein the device is a reaction vessel that encompasses a reactor whose structure essentially reflects the conventional design as described above in reference to FIG. 13 in terms of plasma generation and particle observation. However, as the skilled person knows, reactors can also be configured differently, provided they are set up to manipulate particles according to the invention in a particle arrangement.

The following description relates to two specific embodiments, wherein the first embodiment relates to the manipulation or deposition of particles introduced into the reaction vessel from outside, and the second embodiment relates to the manipulation or deposition of particles generated inside the reaction vessel. However, it will be appreciated that the following description is intended to refer to specific embodiments of the invention illustrated in the drawings and is not intended to define or limit the invention, other than in the appended claims. Also, the drawings are not to scale and various dimensions and proportions are contemplated.

First Embodiment

The following explanation relates to the manipulation of particles that are represented as an essentially planar particle arrangement for the sake of clarity, and labeled with the reference numerals 10, 20, 40, 50, 60 and 70. These particle arrangements are generally non-uniform, and can encompass mono- or multi-layers. The nanoparticles preferably range in size from a few nanometers to about 10 nm, but can also be larger, and are formed inside the reactor or supplied from outside.

Figure 1:
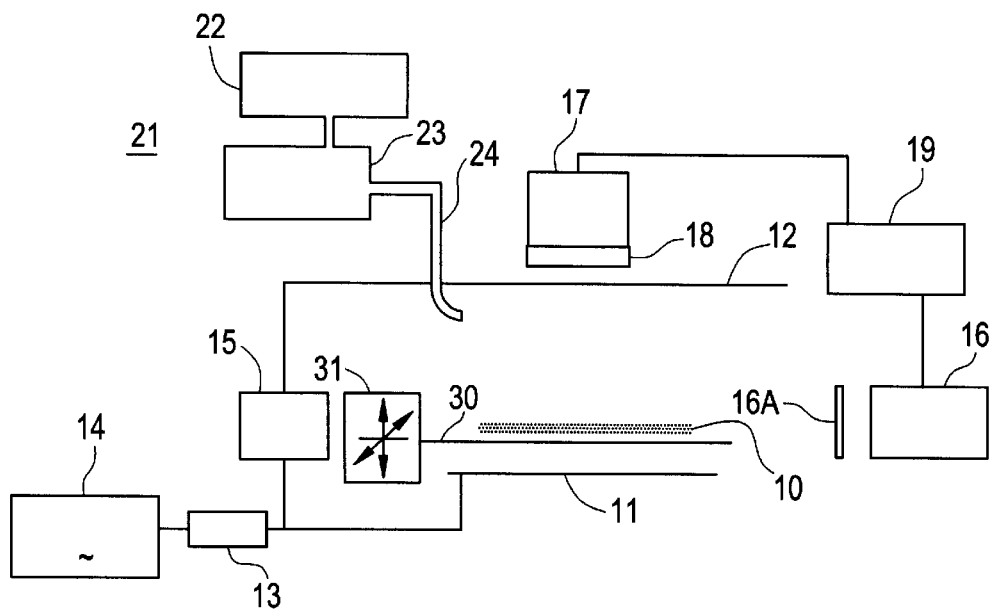
FIG. 1 is a diagrammatic side view of a device according to the invention for manipulating particles.

The diagrammatic side view of a device for manipulating particles according to FIG. 1 shows a HF electrode 11, a grounded counter-electrode 12, a control device 13, an HF generator 14 and a switching device 15. A monitoring lighting source 16 with a cylindrical lens arrangement 16a, monitoring means in the form of a CCD camera 17 with magnification optics 18 and an accompanying control device 19 constitute optical monitoring means which need not absolutely be provided (in particular in the second embodiment, as described below). Very small (<100 nm) particles require a different monitoring means (e.g., involving the use of Bragg scattering). A dust dispenser 21 with a reservoir 22, a conditioning device 23 and an inlet means 24 is set up to bring particles into the space between the HF electrode 11 and counter-electrode 12. The conditioning device 23 can contain a precharging device for the particles, for example.

The device according to the invention also encompasses a substrate 30 that can be moved in all spatial directions with an adjustment device 31. FIG. 1 does not show the wall of the reaction vessel, which forms an enclosed space for the carrier gas and incorporates the electrodes 11, 12, the substrate 30 and parts of the particle inlet device in a vacuum tight manner. The wall can additionally exhibit windows for incoupling and outcoupling radiation.

Figure 2:
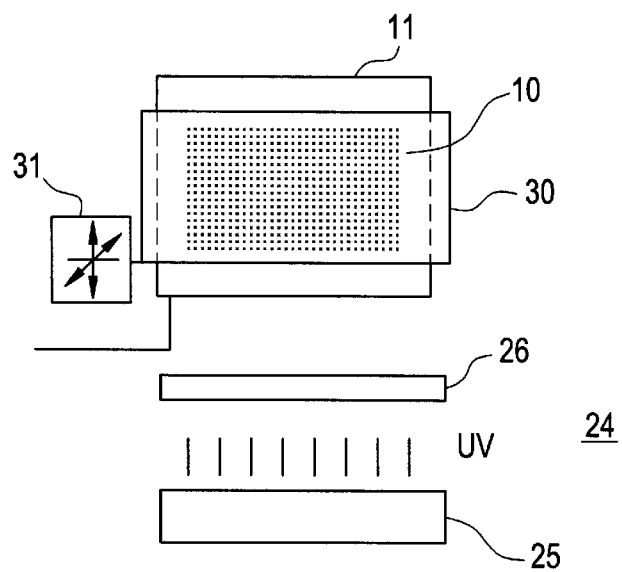
FIG. 2 is a diagrammatic top view of a part of the device according to FIG. 1.

FIG. 2 shows a diagrammatic top view of parts of the device according to the invention shown in FIG. 1, namely the HF electrode 11 and the substrate 30 with the adjustment device 31. Also depicted is a discharging device 24 not shown in FIG. 1, which is set up for the location-selective discharging of particles. In the example shown, the discharging device 24 encompasses a UV radiation source 25 and a suitable imaging and masking system 26, e.g., with which a group of particles or particles in predetermined spatial areas can be irradiated in a location-selective manner and be discharged under exposure to UV radiation.

The UV radiation source 25 and the imaging and masking system 26 can alternatively also constitute a charge-reversing machine 24. In this case, the power of the UV radiation source 25 is selected in such a way that secondary electron emissions arise on the particles during UV illumination, which result in the net charge of the particle being positive. Instead of the depicted embodiment of an expanded UV radiation source 25, a narrowly limited, intensive light source can also be provided, e.g., in the form of a UV laser, wherein the imaging and masking system 26 is then set up for incremental, sequential illumination of the area of the particle arrangement 10 in question. In this case, UV irradiation preferably takes place from above through the annular electrode 12.

As an alternative, the component 25 can also denote an electron source for discharging, wherein the component 26 then represents a beam guiding system. The beam guiding system is used to direct the electron beam from the electron source to the areas of the particle arrangement of interest, in order to reverse the charge of the particles located there via secondary electron emission. This injection of the electron beam also preferably takes place from above through the annular electrode 12.

In the following, a first variant of the procedure according to the invention for manipulating the particles in plasma will be explained, drawing reference to FIGS. 1 and 2.

Plasma is ignited in a carrier gas in the reaction vessel (not shown), in particular between the HF 11 and counter-electrodes 12, which act as the discharge electrodes. One particular advantage to the first embodiment is that no special requirements need be placed on the type of carrier gas. The plasma conditions (type and density of gas, HF power, frequency, pressure, etc.) can be selected by the skilled person based on the conditions of the particle arrangement. For example, low-energy argon discharges or silane discharges can be used under the conditions employed for plasma deposition in semiconductor engineering. The use of a reactive gas, e.g., silane, is advantageous for subsequent treatment steps on the particles. The energy of the ions in the plasma essentially corresponds to the gas temperature. The latter is determined by the discharge conditions and, if necessary, by an outside cooling device. Therefore, for example, a nitrogen cooling system (not shown) can be provided in a device according to the invention.

The particles to be manipulated can be introduced into the electrode space via the dust dispenser 21. The particle size ranges from several nm to about 100 $\mu$m. The lower limit for particle size is determined by the pressure conditions in the reaction vessel, and via the charging. The particles should be heavy enough that the particles execute a vertical motion in the plasma-free state under exposure to the gravitational force and do not remain suspended. The upper limit for particle size is determined by the so-called "Debye length" of the interaction between adjacent particles. The Debye length rises in proportion to the root of the plasma temperature, or inversely proportional to the root of plasma density. Another special advantage of the invention is that, other than the size requirements on the particles to be manipulated, there are no other limitations relative to the shape or material of the particles. Any, e.g., round, needle-shaped, tubular or laminar particles, can be used. The particles must be solid or exhibit sufficient dimensional stability under the plasma conditions. Use is preferably made of a material that possesses special electrical or optical properties in the particle size range in question. A material consisting of various substances, e.g., organic materials, can also be used.

The particles incorporated into the plasma form a particle arrangement 10 (see FIGS. 1, 2). This can be any random particle arrangement.

The HF electrode 11 exhibits a negative d.c. voltage. At an electrode diameter of roughly 8 to 10 cm, an electrode spacing of roughly 2 cm and a preliminary voltage at the HF electrode 11 of roughly −15 V, polymer particles with a characteristic size of roughly 7 $\mu$m become arranged in the form of a planar-shaped cloud at a distance of roughly 0.5 cm from the HF electrode 11.

The system dimensions specified here as an example change correspondingly given altered electrode parameters (electrode diameter, electrode spacing, voltage levels). The electrode diameter, for example, can lie between a few centimeters and 60 cm, while the electrode spacing can range from about 1 cm to about 10 cm. Preferably those electrode parameters that are compatible with available and CVD reactors are selected.

The substrate 30 is arranged between the HF electrode 11 and particle arrangement 10. There are advantageously no limitations with regard to the substrate material and substrate shape as well. In particular, both a conductive or non-conductive substrate can be used without altering the conditions for the particle arrangement.

In a procedure according to the invention for manipulating particles, the particles are first situated in an initial or treatment position. This treatment position can correspond to an equilibrium of forces after introducing the particles into the reactor. However, it is also possible to move the particle arrangement 10, in particular, to alter the relative position vis-à-vis the electrodes or the substrate. For example, this is done by altering the plasma or field conditions. This makes it possible to alter the carrier gas density to achieve a change in the particle charge and, hence, a change in the state of equilibrium between the force of gravitation and electrical power. The same holds true when altering the negative preliminary voltage of the HF electrode or given an outside discharging of the particles. In the treatment position, at least one portion of the particles is subjected to a plasma treatment or applied to the substrate in a subsequent step.

Plasma treatment can encompass a particle surface coating or ablation, for example. In the latter case, for example, the particle arrangement can be incrementally lowered to a small distance from the HF electrode, as a result of which the lowermost layers of the particle arrangement become exposed to a selective plasma etching process. A plasma change during continuous reactor operation can be provided for particle coating, if needed.

Any suitable change in the distance between the particle arrangements and substrate surface can be used for application on the substrate 30. In a first alternative, the particle arrangements are lowered onto the substrate by changing the plasma conditions or through a targeted, location-selective discharge. In a second alternative, the substrate can be lifted to the particle arrangement with the adjustment device 31. In a third, preferred alternative, the discharge between the electrodes is deactivated, so that the plasma is extinguished, and the particles fall on the substrate. When the particles and substrate come into contact, molecular forces of attraction result in the particles becoming adsorbed on the substrate surface. The particle adsorption can be reinforced even further by an overcoat at the same time, or in an additional procedure.

Figure 3:
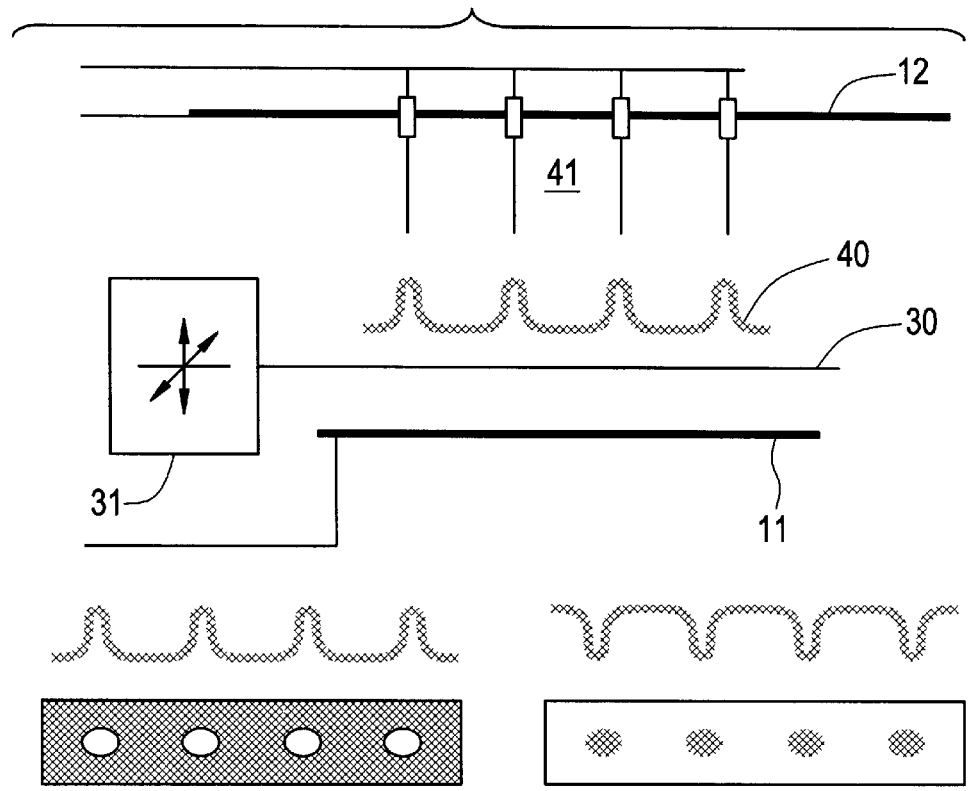
FIG. 3 is a diagrammatic illustration of an electrode configuration according to the invention for manipulating particles, and examples of a location-selective substrate coating.

FIG. 3 shows a diagrammatic side view of a section of a device according to the invention for particle manipulation. Particle arrangements are situated between the HF electrode 11 and the substrate 30, with the adjustment device 31 on the one hand and the grounded counter-electrode 12 on the other. The particle arrangement 40 is designed with a multiply curved cross-sectional shape, which essentially corresponds to the progression of the static electrical field in the space between the electrodes. The field between the electrodes is deformed via an electrode structure 41 in a location-selective way. In the example depicted, the electrode structure is formed by additional electrodes 41 (needle electrodes), which are exposed to a positive voltage, insulated and passed through the counter-electrode 12. The particle arrangement follows the location-selective deformation of the electrical field, so that a multiply curved structure comes about. The additional electrodes 41 can be arranged in rows or sheets. Instead of a positive potential, the additional electrodes 41 can also be exposed to a negative potential.

Shown diagrammatically on the lower part of FIG. 3 are two examples of a location-selective substrate coating with particle arrangements manipulated according to the invention. If the particle arrangement is formed in such a way that the cross-sectional shape exhibits curves facing the top, an approximation of the particle arrangements to the substrate 30 according to the aforementioned first or second alternative results in a coating pattern as reflected in the lower left part of FIG. 3. By contrast, if a curve facing downward is set (through negative potentials of the additional electrodes 41), the reciprocal approximation results in an island-shaped coating according to the lower right part of FIG. 3.

Any coating patterns, e.g., in the form of circles, rings, arcs, stripes or the like can be formed on the substrate surface via a suitable formation of the electrode structure or additional electrodes. Additional modifications are possible if the additional electrodes are moveably arranged per FIG. 3, so that the manipulation of particles 40 over time can be varied. Correspondingly, various coating patterns can be applied to the substrate 30 in sequence.

An alternative configuration for the location-selective shaping of the field between the electrodes is explained below drawing reference to FIGS. 4 to 7.

Figure 4:
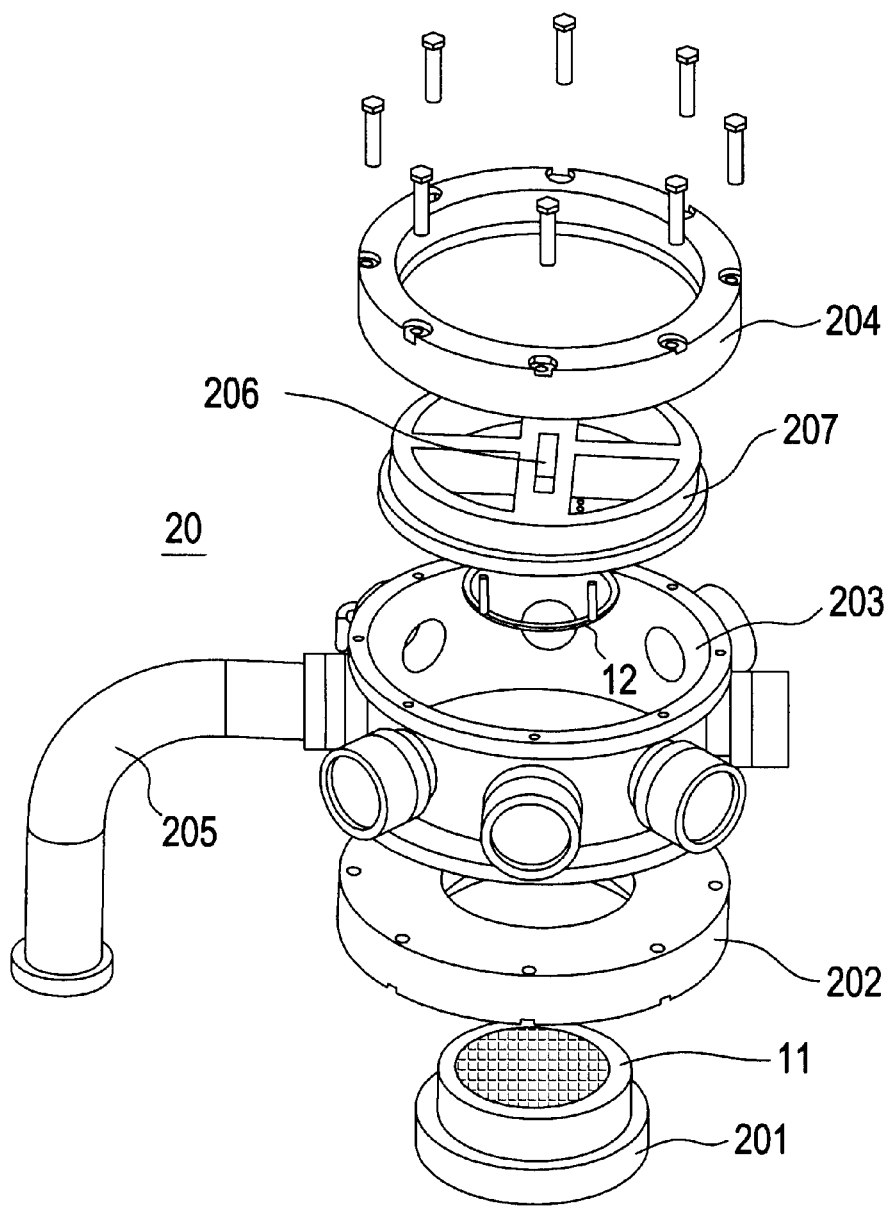
FIG. 4 is an exploded view of a reaction vessel provided with an adaptive electrode according to the invention.

FIG. 4 shows an exploded view of a reaction vessel 20 being adapted for an implementation of the invention. The reaction vessel 20 is not only adapted for the adaptive electrode described below, but may also be realized in connection with the embodiments of the invention shown in the other Figures. The reaction vessel 20 consists of an electrode seat 201, which is embedded in the container bottom 202. The reaction space is enclosed by the container bottom 202 with electrode seat 201, the container wall 203 and the container cover 204, and may be evacuated using the vacuum connection 205. The container cover 204 has an inserted window 206, which is mounted on a subunit 207 of the container cover 204, which may be swivelled vacuum-tight with respect to the container cover 204. It may be provided for that the subunit 207 itself may be swivelled under vacuum. The window insert 206 is designed for accommodating different monitoring or diagnosing means for the particles manipulated within the reaction chamber. The parts of the reaction vessel 20 are connected in the usual manner as for a vacuum vessel. Furthermore, through lateral flange units, additional different diagnostic units may be introduced.

FIG. 4 furthermore shows the adaptive HF electrode 11 and the grounded counter electrode 12 (compare FIG. 1). The counter electrode 12 is of ring-shaped design to form a viewing opening for the monitoring means (not shown).

Figure 5A:
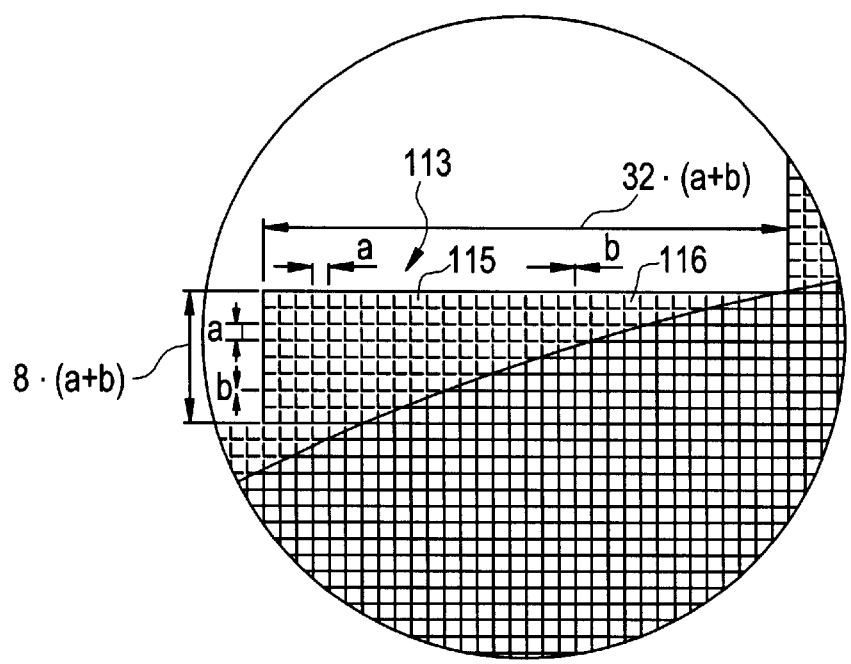
FIG. 5 is a diagrammatic top view of an adaptive electrode according to FIG. 4.
Figure 5B:
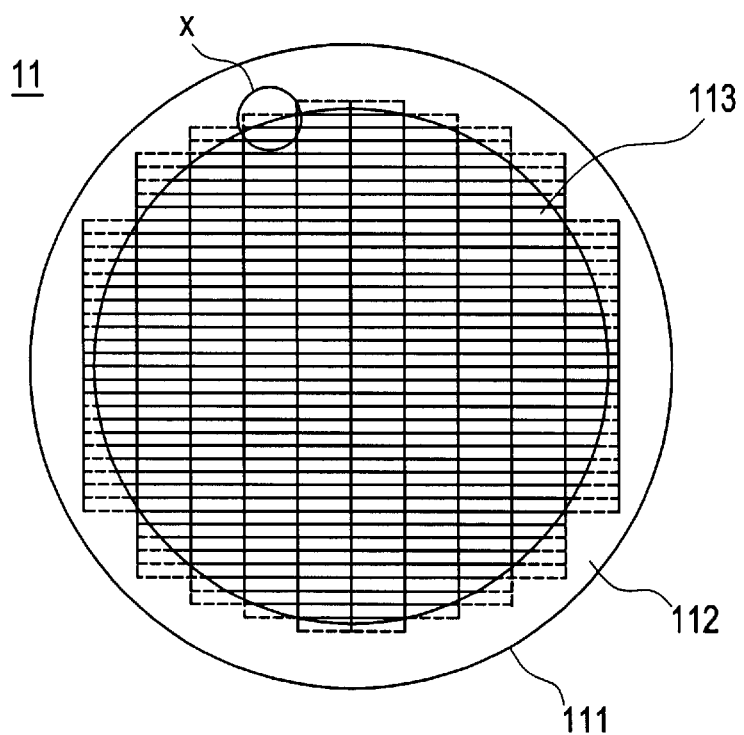

An enlarged top view of the adaptive electrode 11 is shown in FIG. 5. The adaptive electrode 11, according to the usual cylinder shape of vacuum vessels for formation of a field shape undisturbed by external container installations, has an essentially circular edge 111. The edge contains a ring electrode 112 and numerous electrode segments, which for the example shown are compiled in electrode subunits 113. The ring electrode 112 is shown as continuous electrode section made of an integral piece and set up for field correction (flattening) of the electrical field of the high segment electrode section. Alternatively, it is also possible to provide for a segmented electrode section instead of the ring electrode 112, in which the segments are biased with identical fields. In the transitional section between the electrode subunits and the ring electrode, the subunits are modified in their height in such a manner that the ring (possibly milled out from below) may be pushed over the subunits.

The electrode subunits 113 are provided for in an internal section of the electrode 11, surrounded by the ring electrode 112, and each submit including numerous electrode segments. The shape, size and number of electrode segments is designed to be application-dependent under consideration of the spatial requirements made of an electrical direct or low frequency field (E) between the electrodes 11, 12 (compare FIG. 1). The largest variability of the adjustable field shape is achieved by a matrix arrangement of numerous point-shaped electrode segments (hereinafter referred to as "point segments" or "point electrodes"). In this respect, the designation point-shaped electrode segment respectively point segment means that each electrode segment has a limited area facing to the reaction chamber, but this has substantially smaller dimensions than the total size of electrode 11. For instance, each point electrode has a characteristic length dimension being smaller by a factor of about 1/500 to 1/100, for instance 1/300 with respect to the outside dimensions (diameter) of the electrode 11. The matrix grid may be selected to be larger depending on the application. In case of the point grid shape of the adaptive electrode shown here, a characteristic length dimension of the point electrode is preferably equal to or smaller than the Debye length of the particles within the plasma (for instance about 3 mm).

An adaptive electrode 11 for instance has an outside diameter of about 50 cm at a width of the ring electrode 112 of about 5 cm, so that the inner section of the electrode segments 113 has a diameter of about 40 cm. The adaptive electrode subunits 113 may in total for instance include about 50,000 to about 100,000 point segments. A preferred measure for segmenting is a 1.27 mm grid compatible to available 1/20 inch plug installations, as these are explained in greater detail with reference to FIG. 6. In this case, about 80,000 point segments electrically insulated from each other may be arranged within the ring electrode 112.

For reasons of clarity, the lower part of FIG. 5 does not show every single point segment, but the electrode subunits (point segment groups). A groupwise combination of point segments is not a compelling characteristic of the invention, but has advantages in electrode control, as this explained in detail below with reference to FIGS. 7 and 8. For instance, the line pattern in the lower part of FIG. 5 by example shows the electrode subunits 113, which in each case contain 8·32 point segments. This is clarified by the upper part of FIG. 5, showing an enlargement of a section (X) of the edge of the electrode subunits 113. The invention is not limited to combining 8·32 point segments into one electrode subunit, but may, depending on construction and application, include other groupings (for instance 16·16 point segments).

The upper part of FIG. 5 by example shows highlighted an electrode subunit 113 with a plurality of point segments or point electrodes 115, which in each case are electrically separated from each other by means of insulation webs. The point electrodes 115 have square faces of the width a=1.25 mm pointed to the reaction chamber. The insulating stems 116 have a width b=0.02 mm, so that in total the above mentioned 1.27 mm grid results. The electrode subunit 113 for instance includes 8·32 point electrodes 115. It may furthermore be seen from FIG. 5 that the ring electrode 112 and the section of the electrode subunits 113 reciprocally overlap. This achieves an optimum, dense filling of the internal sector of electrode 11 even at the edge of ring electrode 112, as this can be seen in the enlarged part of FIG. 5.

The ring electrode 112 as well as the electrode subunits 113 consist of a metallic electrode material. The material for the electrode is selected to be application-dependent and according to the desired production procedure. In the case of the etching process described below, for instance, stainless steel, aluminum or copper may be used as electrode material. To avoid electrical interference by deposits on the electrode surface, this is preferably coated with an insulating layer, which may for instance consist of the same insulating material as the insulating webs 116. The insulating layer may for instance have a thickness of about 10 $\mu$m to about 100 $\mu$m, preferably about 20 $\mu$m. Any material is suited as insulation material for the insulation webs 116, which ensures sufficient insulation strength between the point electrodes for the voltages occurring. This insulation material is for instance epoxy resin or another suitable plastic material.

Figure 6:
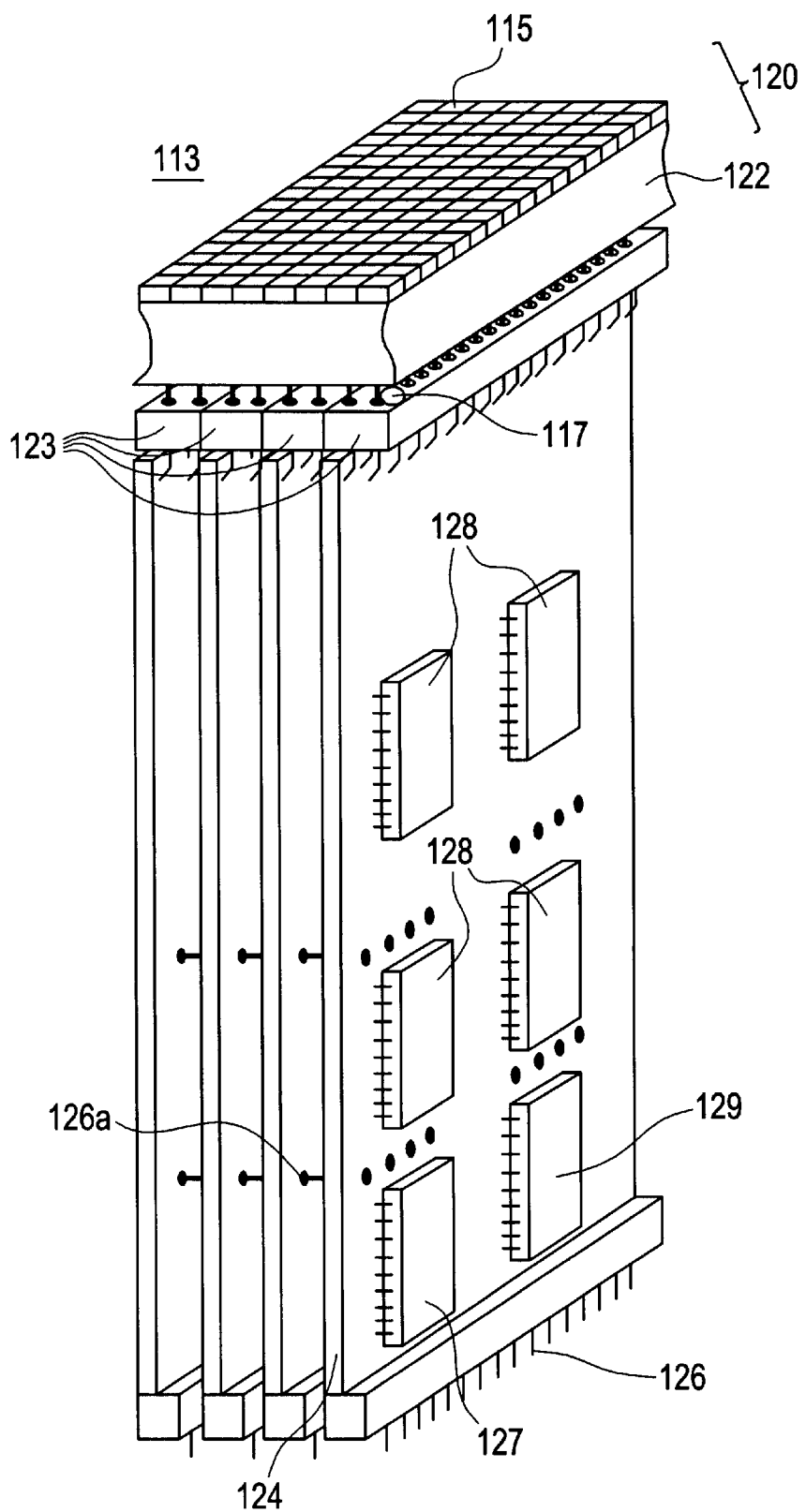
FIG. 6 is a diagrammatic perspective view of a sub-unit of the adaptive electrode shown on FIGS. 4 and 5, with the accompanying switching electronics.

FIG. 6 shows the composition of the segmented electrode by example of an electrode subunit 113. According to the example explained above, the electrode subunit 113 which includes 8·32 point electrodes 115. These form (together with the other segments not shown of the adaptive electrode) an upper electrode section which is also referred to as segmented electrode 120. The segmented electrode furthermore consists of the insulation plate 122, in which a plurality of sockets is embedded (not shown), whose quantity and arrangement in each case corresponds to the point electrodes 115 of the electrode subunit 113. The sockets are provided for accommodation of the plug units 123, which possibly may also take the form of an integrated base plate. It is also possible to install the plug units 123 as sockets and form an electrical connection to the sockets integrated into the insulation plate to create conductive pins. There is an electrical connection between each socket of the insulating plate 122 and the corresponding point electrode 115. The composition of the insulating plate 122 depends on the production process for the overall electrode 11 respectively for the section of the electrode subunits 113. Such a production process is shown below by example.

At first, from the lower side of the insulation plate 122, a drill hole is made for each point electrode 115 through the insulating plate 122 up to the later position of the respective point electrode 115, so that at the end of each point-shaped electrode, which is fastened to the insulating plate using conductive glue, an associated socket for accommodating a pin of the plug-in device 123 is created. Then, a metallic plate or film made of the selected electrode material with the desired outside diameter respectively thickness parameters is glued to a plate made of insulating material with a thickness corresponding to the desired thickness of the insulating plate 122. Then material ablation is performed from the metallic electrode film to form the point electrodes 115, whereby the corresponding positions of the point electrodes are situated above the holes in the insulating plate. For material ablation, channel-shaped free spaces according to the pattern of the insulating webs 116 (compare FIG. 5) are formed. This material ablation is by example performed by a masked etching process, during which the metallic film is removed through to the insulating plate except in the desired positions of the point electrodes. Then, the channels for formation of insulating webs 116 are filled using an insulating material. This may for instance be performed by filling using hardening resin.

In the case of alternative procedures, using corresponding structuring procedures, sockets are formed in the insulating plate 122, which in each case in the direction of the adaptive electrode are closed and electrically connected to the respective point electrode 115. In any case, the segmented electrode forms a vacuum-tight end of the reaction chamber.

On the side of the plug units 123 looking away from the segmented electrode, boards 124 are mounted bearing the connecting plugs 126 to external electronics and addressing, decoder, multiplex and demultiplex circuits 127, 128, 129, respectively, whose function is explained below in detail with reference to FIG. 7. For the embodiment of the invention displayed, four plug units 123 (including the boards 124) for in each case 2·32 point electrodes 115 are combined in one MUX module each for control of 8·32 point electrodes. The distance of the four corresponding boards 124 is determined by the reference grid and is slightly larger than the height of the superimposed circuits 127, 128, 129. This dimensioning may in turn be modified depending on size and application. The four boards 124 are connected to each other by partially conductive stabilizing units 126a.

For easier handling (fitting of the segmented electrode with plug units), it is possible to provide for color coding 117 on the lower side of the insulating plate 122 for each electrode subunit 113. The boards 124 are designed in such a manner that the electronic switching components shown in FIG. 7 may be integrated.

In the following, the electrical control of the adaptive electrode 11 according to the invention is explained under reference to the block diagram according to FIG. 7. FIG. 7 shows, in the reaction vessel 20 (see FIG. 4), point electrodes 115 as part of the HF electrode (adaptive electrode 11) and the counterelectrode 12 (also see for instance FIG. 1). Of the (in total 256) point electrodes 115 of an electrode subunit 113, the first and last point electrode of the first and fourth board 124 are in each case shown enlarged (matrix positions (1,1), (2,64), (7,1), (8,64). Furthermore, the ring electrode 112 is shown.

The electronics section 130 includes all boards 124 (see FIG. 6) allocated to the point electrodes 115. For example, a board 124 for 8·32 point electrodes 115 is shown. The electronics section 130, being the reverse side of the adaptive electrode 11 looking away from the reaction chamber, is subject to a vacuum to avoid excess pressure load on the adaptive electrode 11. The pressure in the electronics section 130 may for instance be in the range from about 10 to about 100 mbar. Alternatively, the electronics section may, as pressure relief for the adaptive electrode, also be filled using an insulating liquid, such as for instance oil, which also may assume a cooling function. Separated from the electronics section 130 are under atmospheric conditions supply circuits 140 and a control device 150 provided for. The supply circuits 140 include an HF generator 141, a power supply circuit 142 for the ring electrode 12 and a control voltage circuit 143.

The board 124 has a coupling circuit 131 for each of the point electrodes 115. The coupling circuit 131 is provided for biasing each point electrode (respectively generally each electrode segment) of the adaptive electrode 11 simultaneously with the output voltage of the HF generator 141 and with segment-specific output voltage of the control voltage circuit 143. According to the invention, the fact is exploited with special advantage that the HF supply is a high frequency signal and the location-selective creation of field distribution in the reaction chamber is with low frequency signal respectively using a static electrical field. For instance, the output parameters of the HF generator 141 have an output frequency in the MHz range (corresponding to the usual frequencies for creation and maintaining plasma, for instance 12 to 15 MHz), and a voltage range of ±150 $V_{SS}$ (sine shaped). In contrary to this, bias for the point electrodes 115 is performed by low frequency ($\leq$100 Hz) or static (direct voltage, DC) control voltages. Accordingly, each coupling circuit 131 contains a capacitor-resistor combination (C1–C256, R1–R256), whereby the HF performance is coupled in jointly through all capacitors.

Each board furthermore provides for an addressing circuit 132, which includes the above mentioned (see FIG. 6) address decoder, multiplexer and demultiplexer circuits 127, 128, 129, which cooperate as follows.

The address decoding circuit 127 depending on the switching signals (DEMUX CONTROL and MUX CONTROL) of the control circuit 150 selects which voltage is switched by the control voltage circuit 143 including multiplex circuit 128 to a central line 133 using a switching frequency of 256 kHz, and from this using the demultiplex circuit 129 to a coupling circuit 131, again selected by the address decoding circuit 127, according to a point electrode 115. For the embodiment shown, the control voltage circuit 143 supplies 64 control voltages to 64 supply lines (also compare FIG. 7). The control voltages on the power supply bus 143a for instance differentiate by voltage steps of 0.625 V and cover the range of ±20 V (direct voltage). Accordingly, the multiplex circuit 128 makes a 1:64 selection for connection of one of the 64 supply lines 143a with the central line 133. For the embodiment shown, furthermore 256 coupling circuits 131 according to the 256 point electrodes 115 are provided for, so that the demultiplex circuit 129 makes a 256:1 selection from the central line 133 to one of the coupling circuits 131.

The point electrodes 115 belonging to a board 124 (according to an electrode subunit) are preferably controlled serially according to a certain sequential pattern. In this respect, with special advantage, a dual function of the coupling capacitors C1–C256 is used. These do not only serve coupling of the HF signal, but also maintenance of the electrode potential at the individual point electrodes for as long as, according to the serial control sequence, there is no connection to the control voltage circuit 143. Because from each point electrode 115 there is a constant current leakage through the plasma, the coupling capacitors C1–C256 must be cyclically recharged to the desired voltage. The coupling capacitors are designed so that the discharge at the respectively coupling capacitor for application-dependent electrode voltages respectively power loss and therefore the voltage loss at the associated point diode during a control cycle is ($\leq 1\%$) with respect to the electrode voltage.

The switching frequency of the address decoding circuit 127 is selected depending on the number of point electrodes 115 belonging to a subunit 113, on the frequency of the control voltage changes and on the voltage constancy during a cycle at the point electrodes, so that the serial cycle sequence by the subunit or segment group 113 has a substantially higher frequency than the low frequency voltage of the control voltage change. This for instance means in case of 256 point electrodes and a desired cycle frequency of about 1 kHz (corresponding to 1,000 recharging processes for each point electrodes per second) a switching frequency of 256 kHz. This fast switching between the voltage stages of the control voltage circuit 143 also enables location-selective modeling of the field shape in the reaction chamber 20 according to pulsating field behavior.

Figure 7:
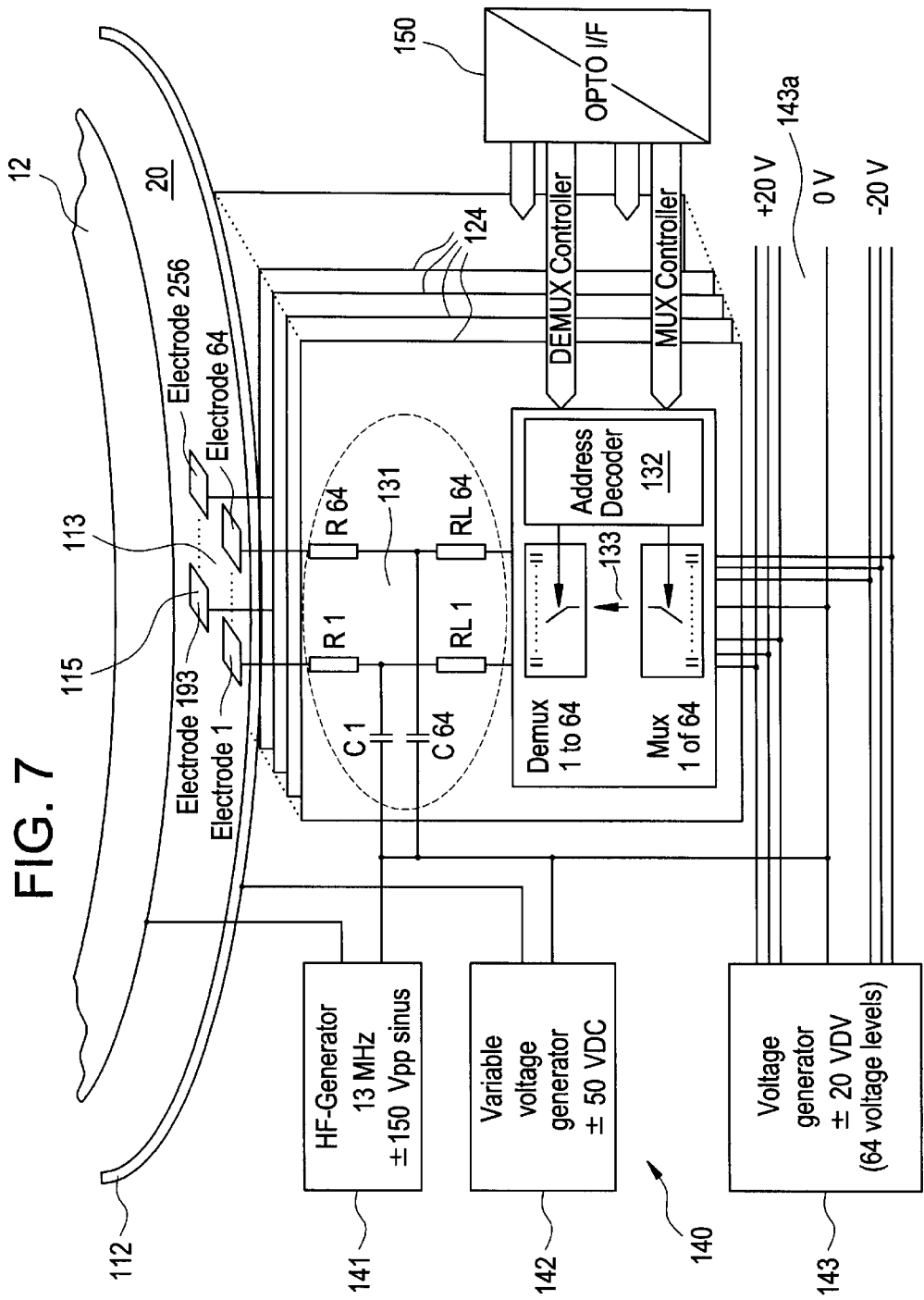
FIG. 7 is a block diagram to illustrate the control of an adaptive electrode according to the invention.

The overall control electronics 140, 150 according to FIG. 7 is superimposed on the HF signal with respect to potential and, therefore, decoupled from the control computer, the network and other interfaces for cooling purposes, etc. with low capacitance. Input of control signals using a control device 150 is preferably performed using an optical coupler.

The adaptive electrode 11 described above and the associated control electronics may be modified as follows. The number, shape and arrangement of electrode segments may be modified depending on the application. When realizing a matrix using point electrodes, the compilation in segment groups may be modified depending on applications. The same holds true for the voltage range of the control voltage circuit 143 and the size of the adjustable voltage steps or stages. Finally, the device in the reaction vessel (see FIG. 4) may be reversed by fitting the grounded electrode 12 on the lower and the HF electrode 11 (especially the adaptive electrode 11) on the upper side.

An important advantage of the adaptive electrode 11 is creation of a programmable spatial stationary or low-frequency electrical field shape within the reaction chamber, by which charged particles may be held in certain locations or moved in a certain manner. This allows the particles to be manipulated so that they can be positioned in any manner.

Figure 8:
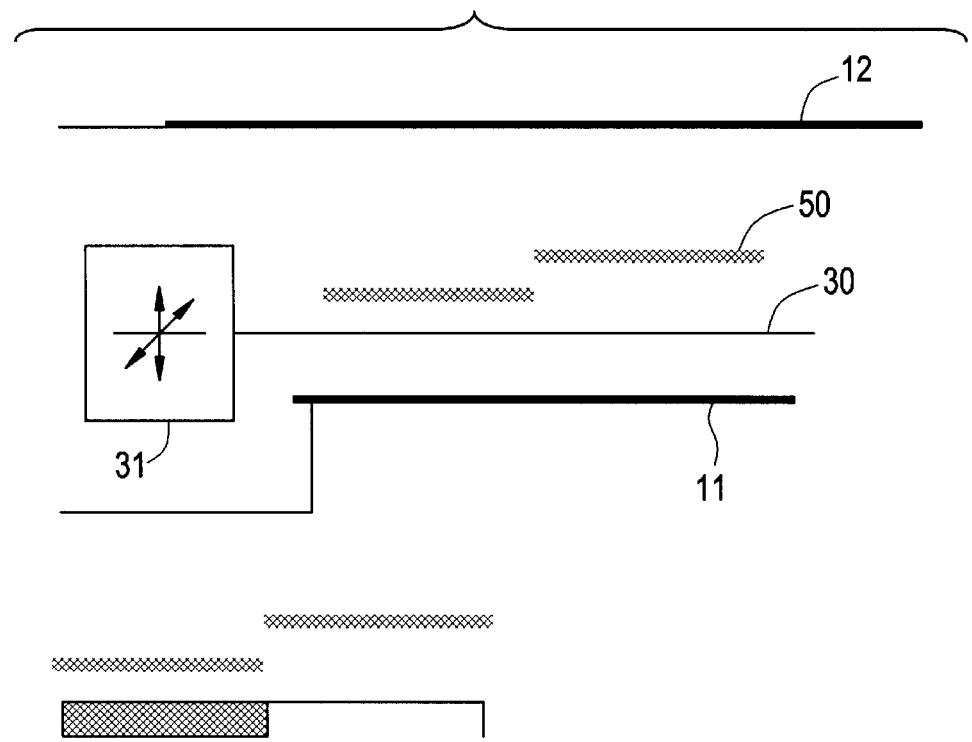
FIG. 8 is a diagrammatic illustration of another example for location-selective substrate coating.
Figure 9:
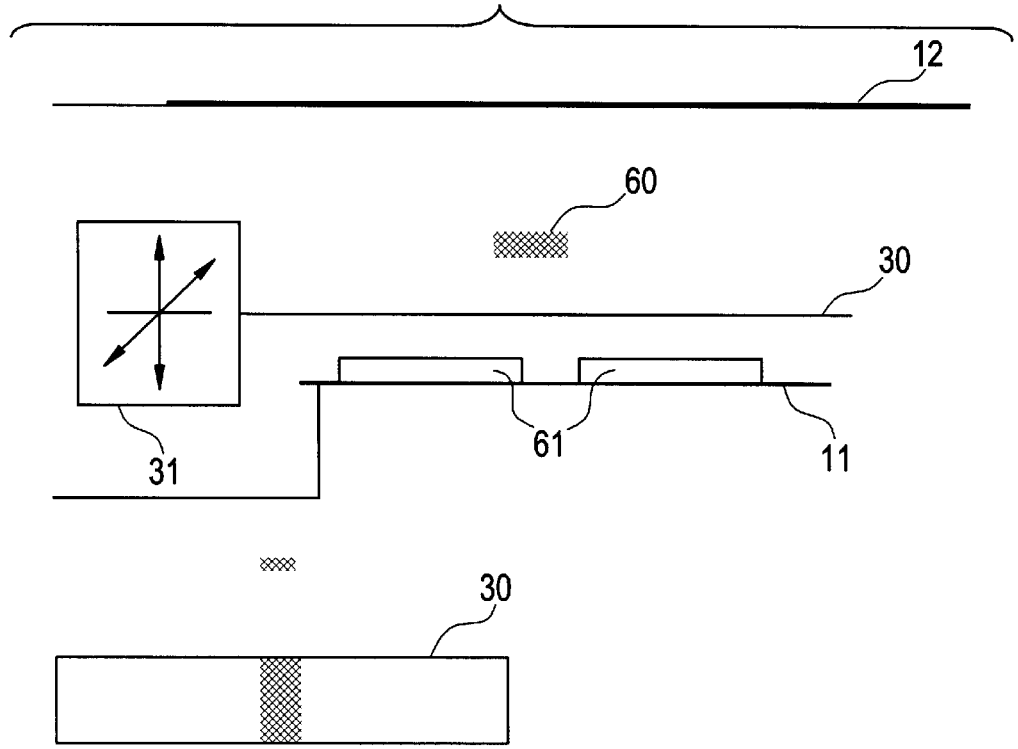
FIG. 9 is a view to illustrate another example for a location-selective substrate coating.

FIG. 9 shows a diagrammatic side view of parts of a device according to the invention, in which the plasma particle arrangement 50 takes the form of steps between the HF electrode 11 and the substrate 30, with the adjustment 31 on the one hand and the counter-electrode 12 on the other. This shape can be achieved, for example, by using a discharging or charge reversing device according to FIG. 2. Partially irradiating the particles with UV light discharges a portion of the particles (left area in FIG. 8), so that the equilibrium is set at a slight height over the HF electrode 11 given unchanged plasma conditions. Correspondingly changing the relative position of the particle arrangement 50 and/or substrate 30 makes it possible to achieve a partial coating of the substrate 30, as illustrated in the lower part of FIG. 8.

The HF electrode 11 can be structured with structural elements 61 according to FIG. 8 to influence the electrical field between the HF electrode 11 and counter-electrode 12 in such a way that the particle arrangement becomes situated only in an area with a potential minimum located over the particles of the HF electrode 11 that are not covered by the structural elements 61. For example, if the structural elements 61 are formed by cover beams that leave a striated gap, the particle arrangement 60 is striated (extends perpendicular to the drawing plane of FIG. 9). The particle arrangement 60 can in turn be deposited on the substrate 30 according to the invention.

As an alternative to the striated design, according to FIG. 9, a portion of the HF electrode 11 can be structured or masked with structural elements 61.

Figure 10:
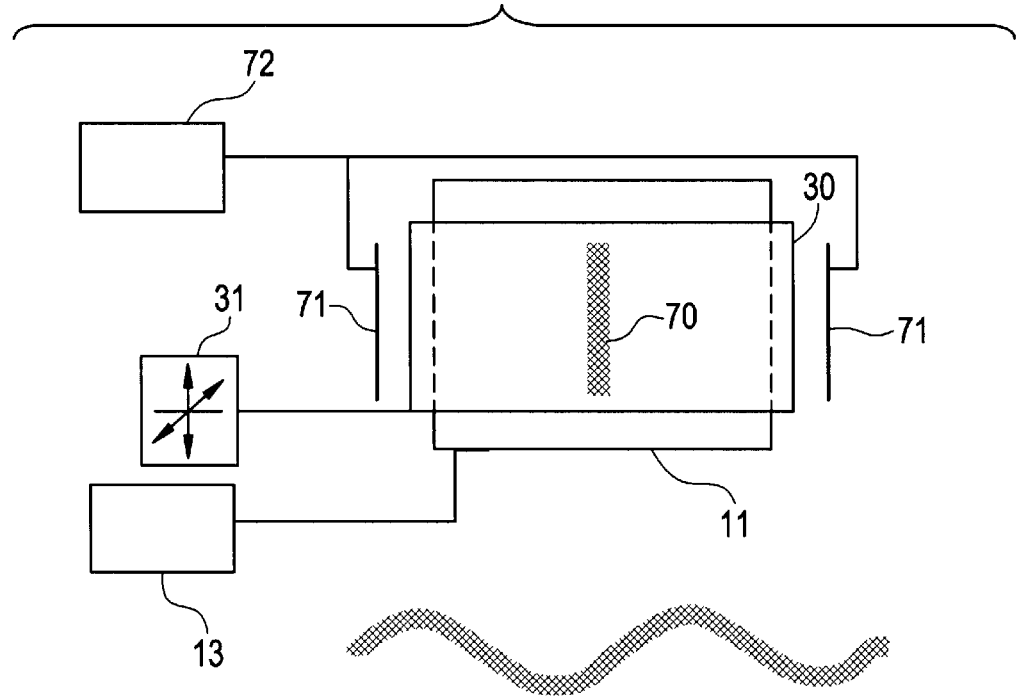
FIG. 10 is a diagrammatic top view of a modified device for manipulating particles and another example for a location-selective substrate coating.

FIG. 10 shows another possibility for exercising outside adjustment forces on the particle arrangement. The diagrammatic top view of a device according to the invention shows the HF electrode 11 with the control device 13 and the substrate 30 with the adjustment device 31. The HF electrode 11 carries structural elements (not shown) according to FIG. 10, so that a striated particle arrangement comes about. The shape of the particle arrangement 70 can be further altered by exposing deflecting electrodes 71 synchronously with an alternating voltage (control circuit 72). The deflecting electrodes 71 are set up for a lateral deflection of a striated particle arrangement in the layer plane. This makes it possible to achieve a serpentine oscillation of particles of the kind shown in FIG. 10, for example. This arrangement can in turn be applied to the substrate 30.

Figure 11:
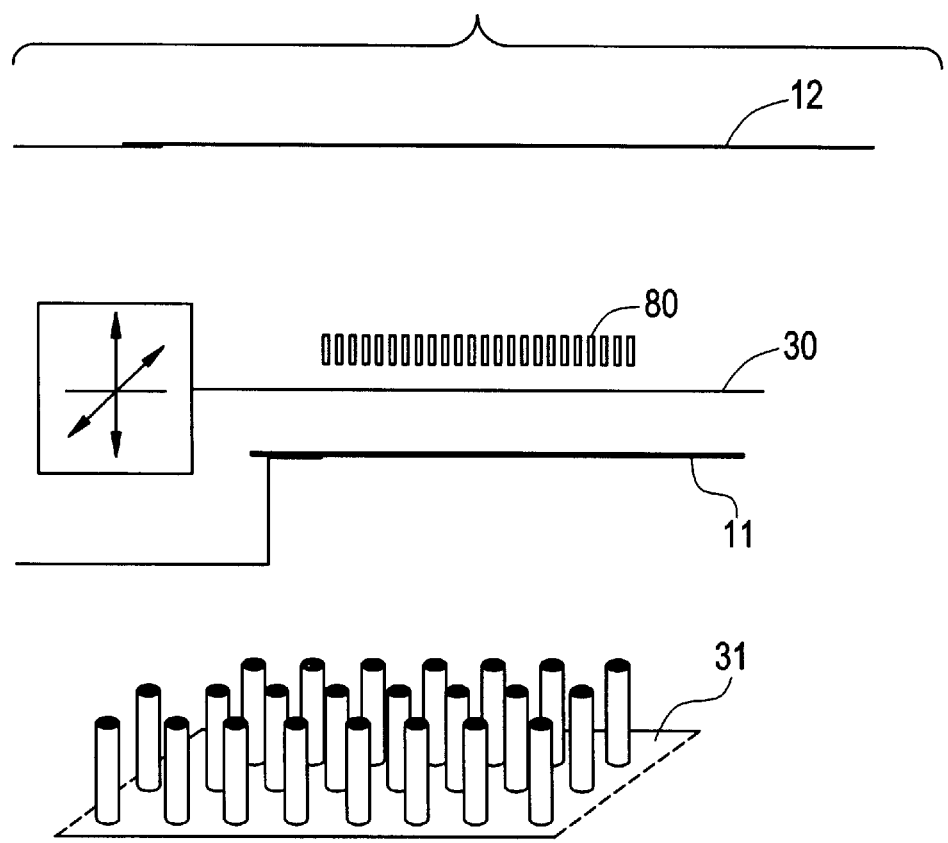
FIG. 11 is a diagrammatic illustration of a substrate coating with so-called "Bucky Tubes"

FIG. 11 shows a surface coating with longitudinally stretched particles, which is set up in particular for achieving anisotropic optical surface properties. The longitudinally stretched particles 80 can be so-called "Bucky Tubes" (microscopic, tubular particles consisting of a uniform arrangement of carbon atoms). The Bucky Tubes can exhibit a length of several micrometers and a diameter of roughly 10 to 20 nm, for example. These particles have a relatively large surface, which leads to a strong charge in the plasma and to polarization. A discharge induced by energetic irradiation triggers a corresponding approach to the substrate 30 and adsorption of the longitudinally stretched particles with a preferred vertical direction, as illustrated in the lower part of FIG. 11. If necessary, these adsorbates can be fixed in position by an additional coating in an extra step.

Figure 12:
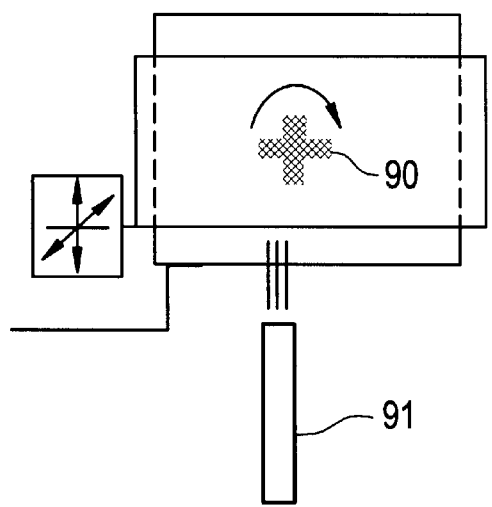
FIG. 12 is a diagrammatic top view of another embodiment of a device according to the invention for manipulating particles.

According to FIG. 12, which shows a top view on parts of a device according to the invention, the particle arrangement 90 can be manipulated by exerting a radiation pressure from an outside light source 91. The outside control light source can be comprised of a helium-neon laser with a power of roughly 10 mW, for example. The radiation pressure exerted on the particles with the laser beam makes it possible to precisely check the position, which can be monitored with a monitoring device 17 (see FIG. 1). The radiation pressure can be used for the preferred rotation of particle arrangements (see arrow), or to move them onto a laterally situated substrate.

In addition to the illustrated embodiments of the invention, additional modifications of the device according to the invention are conceivable by setting up means with which the conditions of the particle arrangements can be altered in a location-selective manner by exerting outside forces. For example, it is possible to use a magnetic field device for the targeted control of the plasma, e.g., via a magnetic field directed perpendicular to the electrode planes. In addition, it is possible to dynamically execute the coating process, wherein particles are continuously fed to the plasma space and applied to the substrate surface in a location-selective manner. Additional modifications relate to the substrate. The substrate need not be flat, but instead can exhibit bent surfaces. Several substrates can be present.

It is also possible to operate a device according to the invention as a display device without application to a substrate, wherein anisotropic particles can be switched between various orientations to indicate predetermined patterns, e.g., each representing a "blackening" or "transparence" state. It is also possible to manipulate particles of various size in different heights of a plasma and illuminate them from the side with excitation light sources of varying wavelengths, so that high-resolution, color displays can be built up.

One special advantage to the invention is that it can be implemented by inexpensively modifying conventional plasma reactors (e.g., from circuit production), whose operating conditions are well-known and controllable. The invention can be used to fabricate so-called designer materials with special surface properties.

Second Embodiment

The second embodiment differs from the first embodiment described above only in that the particles are not externally supplied to the reaction space via a dispenser or the like, but rather come about in this reaction space as the result of aggregation processes in the reaction gas. This includes the aforementioned particle formation in silane-containing reaction gases during the CVD deposition of amorphous silicon layers. However, corresponding applications are possible in all other CVD deposition procedures, in particular with respect to semiconductors.

According to the invention, particles that arise during the plasma deposition in the reaction gas are manipulated with the same means described in relation to the first embodiment above. In particular, it is provided that the particles be discharged or undergo a charge reversal in predetermined partial areas of their formation as the result of a location-selective, energy-rich irradiation. The partial areas correspond to specific deposition patterns according to which the particles are to be embedded into the layer growing on a substrate in the reaction vessel. The deposition patterns are selected to achieve the desired optical or photoelectric properties of the separated layer. Characteristic dimensions of the deposition patterns extend from the resolution limit of the respectively selected energy-rich irradiation (nm range) up to the dimensions of the plasma electrodes. Location-selective deposition is performed simultaneously to layer deposition due to the fact that the particles can be disrupted by the discharge or charge reversal in the equilibrium of force of the fields in the reaction space, and hence can sink down onto the substrate. If no additional, static electrical field is provided as described above to bring about the equilibrium of forces, the discharge or charge reversal process on the particles allows them to traverse the space charge region in proximity to the electrodes or substrate, which would shield the negatively charged particles.

Therefore, the invention also relates to an amorphous semiconductor coating with embedded particles, wherein the particles are limited to specific partial areas of the layer based on a predetermined deposition pattern. The deposition patterns encompass both the lateral particle distribution in the layer plane, as well as a particle distribution substantially perpendicular to the layer plane given a time dependent change in the location-selective discharge or charge reversal processes on the particles in the reaction gas. Therefore, any spatial distributions of particles can be achieved in layers generated via plasma deposition.

In the second embodiment, it is also possible in particular to process the particles in the reaction gas prior to deposition, as was described above drawing reference to the first embodiment. Through exposure to electrical control fields and energetic irradiation, the particles can be transferred for discharge or charge reversal purposes into a plasma area where the particle surface is stripped or the particles are coated with an additional material, wherein the deposition in the layer on the substrate takes place after this processing step.

What is claimed is:

1. A process for manipulating particles in a plasma of a carrier gas or reaction gas within a reactor vessel having high frequency electrodes and a substrate arranged between said electrodes comprising:

distributing the particles substantially non-unifonnly as a non-uniform spatial particle distribution in the plasma, wherein Coulomb interaction between the particles is so low that the particles substantially do not form a plasma crystalline state, the particle distribution being held in a balance between gravitational and electrical forces and the substrate being arranged between the particle distribution and one of the electrodes, modifying the shape of the particle distribution by location-selective effecting the balance between gravitational forces and electrical forces, and arranging and adhering at least a portion of the particles from the modified particle distribution on the substrate by one or more selected from influencing the electrical forces, exerting external adjustment forces holding the particles, moving the substrate and modifyiing plasma conditions in the vessel.

2. A process for manipulating particles in a plasma of a carrier gas or reaction gas within a reactor vessel having high frequency electrodes comprising:

distributing the particles substantially non-uniformly as a non-uniform spatial particle distribution in the plasma, wherein Coulomb interaction between the particles is so low that the particles substantially do not form a plasma crystalline state, the particle distribution being held in a balance between gravitational and electrical forces, moving a predetermined portion of the particle distribution to a treatment position by location-selective effecting the balance between gravitational forces and electrical forces, by exerting external adjustment forces or by modifying the plasma conditions, and subjecting the particles in the treatment position to a plasma treatment comprising a particle surface coating or ablation.

3. The process according to claim 1 or 2, wherein the external adjustment forces are selected and are generated in a location-selective manner via an electrical particle discharge, a particle charge reversal or a light radiation pressure.

4. The process according to claim 3, wherein the electrical particle discharge or the particle charge reversal are selected and takes place via location-selective UV, electron irradiation or laser charge reversal of the particles.

5. The process according to claim 1 or 2, wherein modifying the plasma conditions is used and the change in the plasma conditions encompasses a change in plasma pressure, plasma temperature, the carrier gas, plasma energy and/or an operating frequency of the plasma, deactivation of plasma generation or an influencing of electrical fields in an area of the particles.

6. The process according to claim 5, wherein the influencing of electrical fields is selected and encompasses setting a static or low-frequency variable electrical field in such a way that the particles become arranged or move at a low frequency along a predetermined, bent surface or in an area with predetermined.

7. The process according to claim 1, wherein the particles are elongated and rod-shaped and applied to the substrate surface in such a way that the rod shape essentially extends perpendicularly from the substrate surface.

8. The process according to claim 1 or 2, wherein the particles are formed in the reaction gas or introduced into the plasma outside the reactor vessel.

9. The process according to claim 1, wherein, while coating takes place with a plasma chemical vapor deposition (CVD) deposition process on the substrate from a reaction gas, particles formed in the reaction gas are manipulated or simultaneously embedded in the coating.

10. The process according to claim 9, wherein the particles are nanocrystalline semiconductor particles which are embedded in the coating which is a semiconductor layer according to a predetermined deposition pattern.

11. The process according to claim 10, wherein the semiconductor layer with the embedded nanocrystalline semiconductor particles is part of a photovoltaic device.

12. The process according to claim 1 or 2, wherein the particles have characteristic sizes of a few nanometres to 10 nm.

* * * * *

UNITED STATES PATENT AND TRADEMARK OFFICE
CERTIFICATE OF CORRECTION

PATENT NO. : 6,616,987 B1
DATED : September 9, 2003
INVENTOR(S) : Morfill et al.

It is certified that error appears in the above-identified patent and that said Letters Patent is hereby corrected as shown below:

<u>Title page,</u>
Item [73], Assignee, please add the second Assignee as follows: -- Kayser-Threde GmbH, Germany --.

Signed and Sealed this

Twenty-second Day of June, 2004

JON W. DUDAS
*Acting Director of the United States Patent and Trademark Office*